(12) United States Patent
Inatomi et al.

(10) Patent No.: US 9,761,485 B2
(45) Date of Patent: Sep. 12, 2017

(54) CATALYST LAYER FORMING METHOD, CATALYST LAYER FORMING SYSTEM, AND RECORDING MEDIUM

(71) Applicant: Tokyo Electron Limited, Tokyo (JP)

(72) Inventors: Yuichiro Inatomi, Nirasaki (JP); Takashi Tanaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 33 days.

(21) Appl. No.: 14/796,227

(22) Filed: Jul. 10, 2015

(65) Prior Publication Data

US 2016/0013102 A1    Jan. 14, 2016

(30) Foreign Application Priority Data

Jul. 14, 2014  (JP) .................. 2014-144485

(51) Int. Cl.

| | |
|---|---|
| *H01L 21/31* | (2006.01) |
| *H01L 21/469* | (2006.01) |
| *H01L 21/768* | (2006.01) |
| *H01L 21/288* | (2006.01) |
| *C23C 18/16* | (2006.01) |
| *C23C 18/18* | (2006.01) |
| *C23C 18/40* | (2006.01) |
| *C23C 18/50* | (2006.01) |
| *C25D 7/00* | (2006.01) |

(52) U.S. Cl.
CPC .... *H01L 21/76874* (2013.01); *C23C 18/1633* (2013.01); *C23C 18/1651* (2013.01); *C23C 18/1653* (2013.01); *C23C 18/1696* (2013.01); *C23C 18/1893* (2013.01); *C23C 18/40* (2013.01); *C23C 18/50* (2013.01); *H01L 21/288* (2013.01); *H01L 21/76843* (2013.01); *H01L 21/76873* (2013.01); *H01L 21/76898* (2013.01); *C25D 7/00* (2013.01)

(58) Field of Classification Search
None
See application file for complete search history.

(56) References Cited

U.S. PATENT DOCUMENTS

| | | | |
|---|---|---|---|
| 2008/0079154 A1* | 4/2008 | Osaka ................ | C23C 18/1651 257/751 |
| 2015/0140816 A1* | 5/2015 | Tanaka .............. | H01L 21/76874 438/678 |
| 2016/0013101 A1* | 1/2016 | Inatomi ............. | H01L 21/76898 118/59 |
| 2016/0247765 A1* | 8/2016 | Inatomi ............... | C23C 18/1879 |
| 2016/0284592 A1* | 9/2016 | Hoshino ........... | H01L 21/67051 |

FOREIGN PATENT DOCUMENTS

| | | |
|---|---|---|
| JP | 2013-067856 A | 4/2013 |
| JP | 2013-194306 A | 9/2013 |

* cited by examiner

*Primary Examiner* — Zandra Smith
*Assistant Examiner* — John M Parker
(74) *Attorney, Agent, or Firm* — Pearne & Gordon LLP

(57) ABSTRACT

A catalyst layer can be uniformly formed on an entire surface of a substrate and an entire inner surface of a recess. A catalyst layer forming method of forming the catalyst layer on the substrate includes a first supply processing of forming a substrate surface catalyst layer 22A by supplying a catalyst liquid on the entire surface of the substrate 2; and a second supply processing of forming a recess inner surface catalyst layer 22B by supplying the catalyst liquid to a central portion of the substrate 2 while rotating the substrate 2.

7 Claims, 5 Drawing Sheets

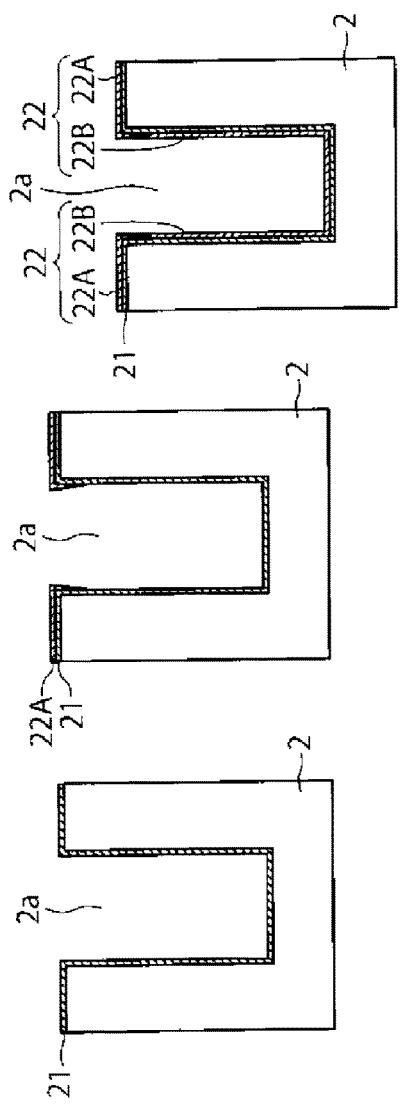

FIG. 4

| PROCESSING | ROTATION NUMBER, TIME, DISCHARGE OPERATION | FLOW RATE | |
|---|---|---|---|
| DIW | 500rpm 1min CENTER-FIX | 1.5L | ⎫ DEIONIZED WATER SUBSTITUTION PROCESSING IN RECESS |
| IPA | 500rpm 1min CENTER-FIX | 35-40mL/min | |
| DIW | 500rpm 3min CENTER-FIX | 1.5L | ⎭ |
| Pd1 | 300rpm 5min Scan | 650mL/min ← | FIRST SUPPLY PROCESSING |
| Pd2 | 500rpm 5min CENTER-FIX | 1.0L/min ← | SECOND SUPPLY PROCESSING |
| DIW | 500rpm/10min CENTER-FIX | 1.0L/min | ⎫ RINSING AND DRYING PROCESSING |
| IPA | 300rpm/1min Scan → DRY 550rpm 70sec DRYING PROCESSING CONTROL + N₂ | 35-40mL/min | ⎭ |

CATALYST LAYER FORMING METHOD, CATALYST LAYER FORMING SYSTEM, AND RECORDING MEDIUM

CROSS-REFERENCE TO RELATED APPLICATION

This application claims the benefit of Japanese Patent Application No. 2014-144485 filed on Jul. 14, 2014, the entire disclosures of which are incorporated herein by reference.

TECHNICAL FIELD

The embodiments described herein pertain generally to a catalyst layer forming method and a catalyst layer forming system of forming a catalyst layer on a substrate, and a recording medium therefor.

BACKGROUND

Recently, semiconductor devices such as a LSI or the like have been required to have higher density in order to meet requirements for reducing the mounting space or for improving the processing rate. As an example of a technology that achieves the high density, there has been known a multilayer wiring technology of manufacturing a multilayer substrate, such as a three-dimensional LSI or the like, by stacking multiple wiring substrates.

According to the multilayer wiring technology, a through-via-hole, which penetrates the wiring substrates and in which a conductive material such as copper (Cu) is buried, is typically formed in the wiring substrate in order to obtain electrical connection between the wiring substrates. As an example of a technology for forming the through-via-hole in which a conductive material is buried, there has been known an electroless plating method.

As a specific method of producing a wiring substrate, there is known a method in which a substrate having a recess is prepared, a barrier film as a Cu diffusion barrier film is formed on the recess of the substrate, and a seed film is formed on the barrier film by electroless Cu plating. Thereafter, Cu is buried within the recess by electrolytic Cu plating, and the substrate in which the Cu is buried is then thinned by a polishing method such as chemical mechanical polishing. Through this processing, a wiring substrate having a through-via-hole in which the Cu is buried is manufactured.

To form the barrier film of the aforementioned wiring substrate, by adsorbing a catalyst onto the substrate in advance, a catalyst layer is formed, and by performing a plating processing on the catalyst layer, a barrier film formed of a Co—W—B layer is obtained. The barrier film is then baked, so that moisture within the barrier film is removed and the bond between metals is strengthened.

Meanwhile, there has been developed a technique using a palladium nanoparticle or the like as a catalyst in the case of adsorbing the catalyst onto the substrate.

Patent Document 1: Japanese Patent Laid-open Publication No. 2013-067856

As described above, there has been developed a technique using a palladium nanoparticle or the like as a catalyst in the case of adsorbing the catalyst to a substrate.

However, it is difficult to uniformly adsorb the catalyst to the entire surface of the substrate, and such a method has not yet been developed.

SUMMARY

In view of the foregoing, the exemplary embodiments provide a catalyst layer forming method and a catalyst layer forming system in which a catalyst layer can be formed by uniformly adsorbing a catalyst to an entire surface of a substrate, and a recording medium therefor.

In one exemplary embodiment, a catalyst layer forming method of forming a catalyst layer on a substrate includes a preparation processing of preparing the substrate including a recess; a first supply processing of forming a substrate surface catalyst layer by supplying a catalyst liquid including a catalyst on the substrate such that the catalyst liquid is widely diffused to an entire surface of the substrate and by uniformly adsorbing the catalyst to the entire surface of the substrate; and a second supply processing of forming a recess inner surface catalyst layer by supplying the catalyst liquid to a central portion of the substrate while rotating the substrate and by adsorbing the catalyst to an entire inner surface of the recess.

In another exemplary embodiment, a catalyst layer forming system of forming a catalyst layer on a substrate includes a substrate holding/rotating device configured to rotatably hold the substrate including a recess; a first supply unit configured to form a substrate surface catalyst layer by supplying a catalyst liquid including a catalyst on the substrate such that the catalyst liquid is widely diffused to an entire surface of the substrate and by uniformly adsorbing the catalyst to the entire surface of the substrate; and a second supply unit configured to form a recess inner surface catalyst layer by supplying the catalyst liquid to a central portion of the substrate while the substrate is rotated by the substrate holding/rotating device and by adsorbing the catalyst to an entire inner surface of the recess.

In yet another exemplary embodiment, a computer-readable recording medium has stored thereon computer-executable instructions that, in response to execution, cause a catalyst layer forming system to perform a catalyst layer forming method of forming a catalyst layer on a substrate. Further, the catalyst layer forming method includes: a preparation processing of preparing the substrate including a recess; a first supply processing of forming a substrate surface catalyst layer by supplying a catalyst liquid including a catalyst on the substrate such that the catalyst liquid is widely diffused to an entire surface of the substrate and by uniformly adsorbing the catalyst to the entire surface of the substrate; and a second supply processing of forming a recess inner surface catalyst layer by supplying the catalyst liquid to a central portion of the substrate while rotating the substrate and by adsorbing the catalyst to an entire inner surface of the recess.

According to the exemplary embodiments, it is possible to form the catalyst layer by uniformly adsorbing the catalyst to the entire surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3A to FIG. 3G are diagrams illustrating a substrate to which the plating method is performed;

FIG. 4 is a process diagram illustrating a first supply processing and a second supply processing of a catalyst layer forming method according to the exemplary embodiment;

DETAILED DESCRIPTION

Figure 1:
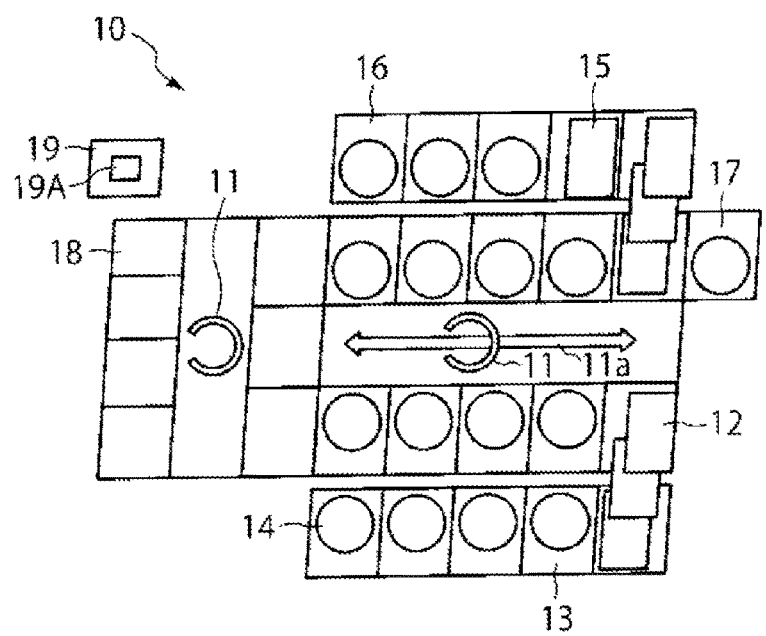
FIG. 1 is a block diagram illustrating a plating system including a catalyst layer forming system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Plating System>

An exemplary embodiment will be described with reference to FIG. 1 to FIG. 7.

A plating system including a catalyst layer forming system will be described with reference to FIG. 1.

As illustrated in FIG. 1, a plating system 10 is configured to perform a plating processing to a substrate (silicon substrate) 2, such as a semiconductor wafer, having a recess 2a (see FIG. 3A to FIG. 3G).

The plating system 10 includes a cassette station 18 configured to place a cassette (not shown) which accommodates the substrate 2; a substrate transfer arm 11 configured to take out the substrate 2 from the cassette on the cassette station 18 and transfer the substrate 2; and a moving path 11a along which the substrate transfer arm 11 is moved.

Arranged at one side of the moving path 11a are an adhesion layer forming unit 12 configured to form an adhesion layer 21 to be described later by adsorbing a coupling agent such as a silane coupling agent onto the substrate 2; a catalyst layer forming unit 13 configured to form a catalyst layer 22 to be described later by adsorbing a catalyst onto the adhesion layer 21 of the substrate 2; and a plating layer forming unit 14 configured to form a plating layer 23 serving as a Cu diffusion barrier film (barrier film) to be described later on the catalyst layer 22 of the substrate 2.

Further, arranged at the other side of the moving path 11a are a plating layer baking unit 15 configured to bake the plating layer 23 formed on the substrate 2; and an electroless Cu plating layer forming unit 16 configured to form an electroless copper (Cu) plating layer 24, serving as a seed film to be described later, on the plating layer 23 formed on the substrate 2.

Further, an electrolytic Cu plating layer forming unit 17 configured to fill the recess 2a of the substrate 2 with an electrolytic copper (Cu) plating layer 25 while using the electroless Cu plating layer 24 as a seed film is provided adjacent to the plating layer baking unit 15.

Further, the respective constituent components of the above-described plating system, for example, the cassette station 18, the substrate transfer arm 11, the adhesion layer forming unit 12, the catalyst layer forming unit 13, the plating layer forming unit 14, the plating layer baking unit 15, the electroless Cu plating layer forming unit 16 and the electrolytic Cu plating layer forming unit 17 are controlled by a control unit 19 according to various types of programs recorded in a recording medium 19A provided in the control unit 19, so that various processes are performed on the substrate 2. Here, the recording medium 19A stores thereon various kinds of setup data or various kinds of programs such as a plating method to be described later. The recording medium 19A may be implemented by a computer-readable memory such as a ROM or a RAM, or a disk-type recording medium such as a hard disk, a CD-ROM, a DVD-ROM or a flexible disk, as commonly known in the art.

Hereinafter, the catalyst layer forming unit ("catalyst layer forming system") 13 configured to form the catalyst layer 22 will be further described.

Figure 5:
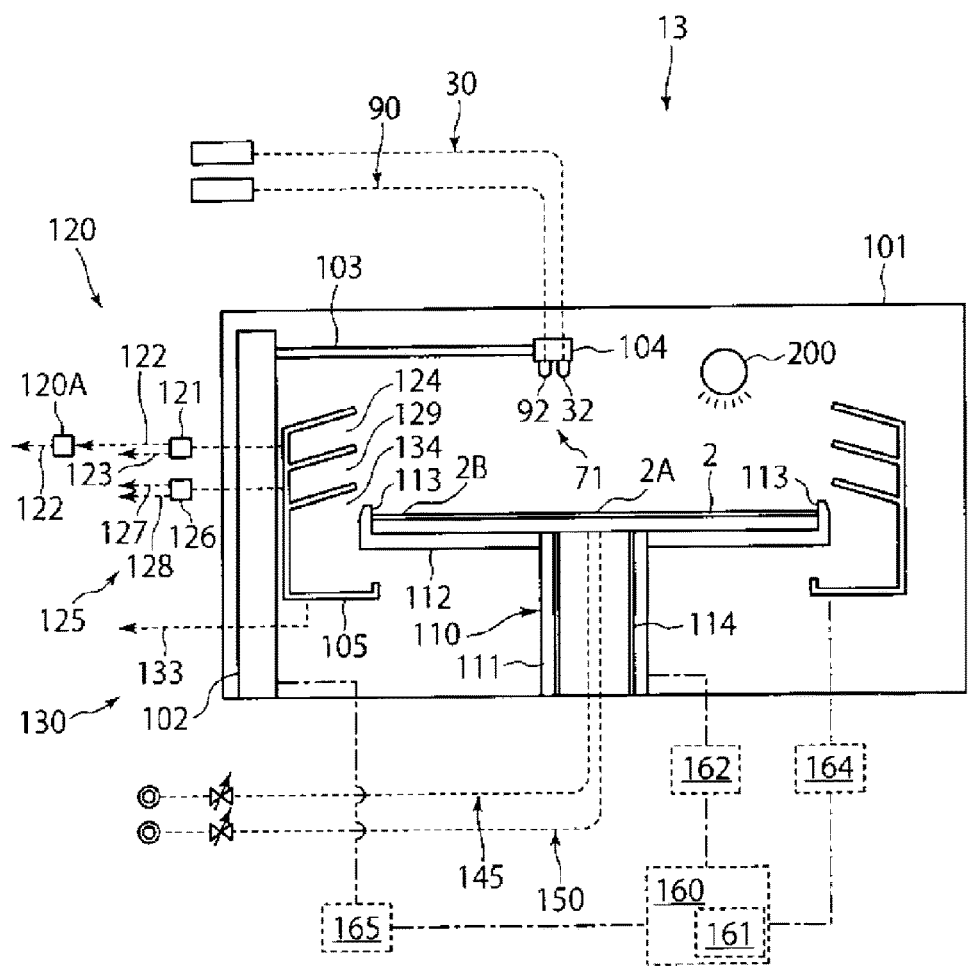
FIG. 5 is a side cross-sectional view illustrating the catalyst layer forming system.
Figure 6:
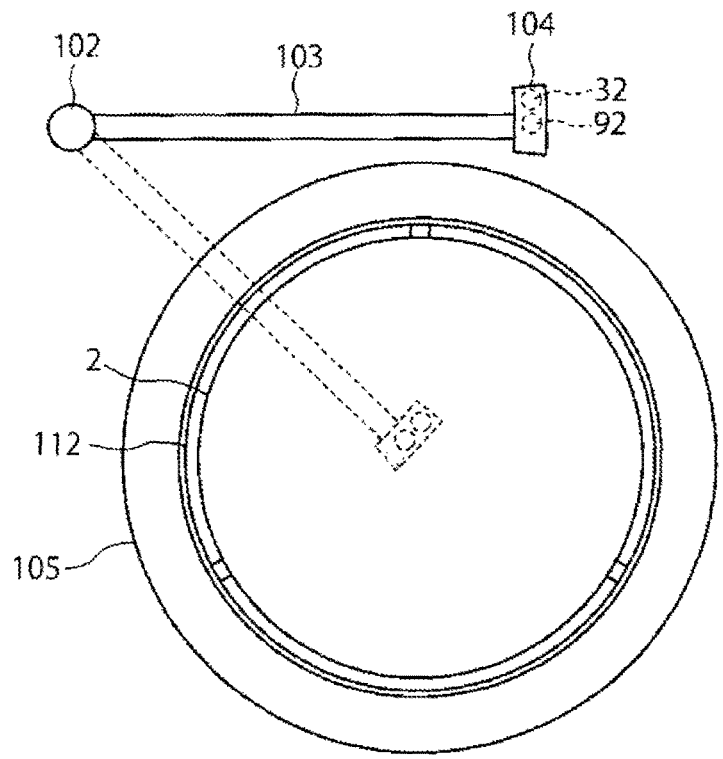
FIG. 6 is a plan view illustrating the catalyst layer forming system.

The catalyst layer forming unit 13 may be configured as a liquid processing apparatus illustrated in FIG. 5 and FIG. 6.

Further, the plating layer forming unit 14 and the electroless Cu plating layer forming unit 16 may also be configured as the same liquid processing apparatus as the catalyst layer forming unit 13. The catalyst layer forming unit 13 is the same as illustrated in FIG. 5 and FIG. 6.

The catalyst layer forming unit (catalyst layer forming system) 13 includes, as shown in FIG. 5 and FIG. 6, a substrate holding/rotating device (substrate accommodating unit) 110 configured to hold and rotate the substrate 2 within a casing 101; liquid supplying devices 30 and 90 configured to supply a catalyst liquid, a cleaning liquid or the like onto a surface of the substrate 2; a recovery cup 105 configured to receive and collect the catalyst liquid, the cleaning liquid or the like dispersed from the substrate 2; draining openings 124, 129 and 134 through which the catalyst liquid or the cleaning liquid collected by the recovery cup 105 is drained; liquid draining devices 120, 125 and 130 configured to drain the liquids collected through the draining openings; and a controller 160 configured to control the substrate holding/rotating device 110, the liquid supplying devices 30 and 90, the recovery cup 105 and the liquid draining devices 120, 125 and 130.

<Substrate Holding/Rotating Device>

The substrate holding/rotating device 110 includes, as illustrated in FIG. 5 and FIG. 6, a hollow cylindrical rotation shaft 111 vertically extended within the casing 101; a turntable 112 provided on an upper end portion of the rotation shaft 111; a wafer chuck 113 disposed on a peripheral portion of a top surface of the turntable 112 to support the substrate 2; and a rotating device 162 configured to rotate the rotation shaft 111. The rotating device 162 is controlled by the controller 160, and the rotation shaft 111 is rotated by the rotating device 162. As a result, the substrate 2 supported on the wafer chuck 113 is rotated.

Now, the liquid supplying devices 30 and 90 configured to supply the catalyst liquid, a cleaning liquid, or the like onto the surface of the substrate 2 will be explained with reference to FIG. 5 and FIG. 6. The catalyst liquid supplying device 30 is a catalyst liquid supplying device configured to supply the catalyst liquid on the surface of the substrate 2. The cleaning liquid supplying device 90 is a cleaning liquid supplying device configured to supply a cleaning liquid onto the surface of the substrate 2.

As depicted in FIG. 5 and FIG. 6, a discharge nozzle 32 is provided at a nozzle head 104. The nozzle head 104 is provided at a tip end portion of an arm 103. The arm 103 is provided at a supporting shaft 102 rotated by a rotating device 165 to be moved in a vertical direction. A catalyst liquid supplying line of the catalyst liquid supplying device 30 is embedded within the arm 103. With this configuration, it is possible to discharge the catalyst liquid onto a target position on the surface of the substrate 2 through the discharge nozzle 32 from a required supply height.

The cleaning liquid supplying device 90 is configured to perform a cleaning processing on the substrate 2 as will be described later. As illustrated in FIG. 5, the cleaning liquid supplying device 90 includes a nozzle 92 provided at the nozzle head 104. In this configuration, either a cleaning liquid or a rinsing liquid is selectively discharged onto the surface of the substrate 2 from the nozzle 92.

<Liquid Draining Device>

Now, the liquid draining devices 120, 125 and 130 configured to drain out the catalyst liquid or the cleaning liquid dispersed from the substrate 2 will be elaborated with reference to FIG. 5. As shown in FIG. 5, the recovery cup 105, which can be moved up and down by an elevating device 164 and is provided with the draining openings 124, 129 and 134, is disposed within the casing 101. The liquid draining devices 120, 125 and 130 are configured to drain out the liquids collected through the draining openings 124, 129 and 134, respectively.

As depicted in FIG. 5, the plating liquid draining devices 120 and 125 include recovery flow paths 122 and 127 and waste flow paths 123 and 128, which are switched by flow path switching devices 121 and 126, respectively. Here, the catalyst liquid is collected and reused through the recovery flow paths 122 and 127, while the catalyst liquid is drained out through the waste flow paths 123 and 128. Further, as shown in FIG. 5, the processing liquid draining device 130 is only equipped with a waste flow path 133.

Further, as depicted in FIG. 5 and FIG. 6, the recovery flow path 122 of the catalyst liquid draining device 120 configured to drain the catalyst liquid is connected to an outlet side of the substrate accommodating unit 110, and a cooling buffer 120A configured to cool the catalyst liquid is provided at a portion of the recovery flow path 122 in the vicinity of the outlet side of the substrate accommodating unit 110.

Now, the plating layer baking unit 15 will be elaborated.

Figure 7:
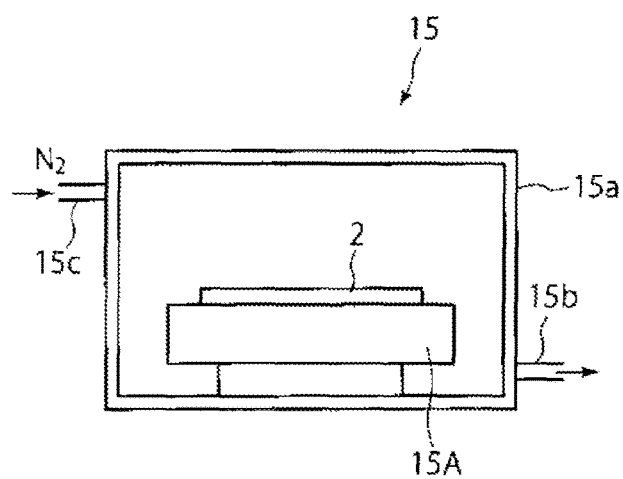
FIG. 7 is a side cross-sectional view illustrating a plating layer baking unit.

The plating layer baking unit 15 includes, as illustrated in FIG. 7, an airtightly sealed casing 15a; and a hot plate 15A provided within the airtightly sealed casing 15a.

The airtightly sealed casing 15a of the plating layer baking unit 15 is provided with a transfer opening (not shown) through which the substrate 2 is transferred. An $N_2$ gas is supplied into the airtightly sealed casing 15a through an $N_2$ gas supply opening 15c.

Concurrently, the inside of the airtightly sealed casing 15a is evacuated through an exhaust port 15b, and by supplying the $N_2$ gas into the airtightly sealed casing 15a, the inside of the airtightly sealed casing 15a can be maintained under an inert gas atmosphere.

<Plating Method>

Hereinafter, an effect of the present exemplary embodiment as described above will be described with reference to FIG. 2 to FIG. 4.

First, in a pre-processing, a recess 2a is formed on a substrate (silicon substrate) 2 such as a semiconductor wafer or the like. The substrate 2 having thereon the recess 2a is then transferred into the plating system 10 according to the exemplary embodiment.

Figure 2:
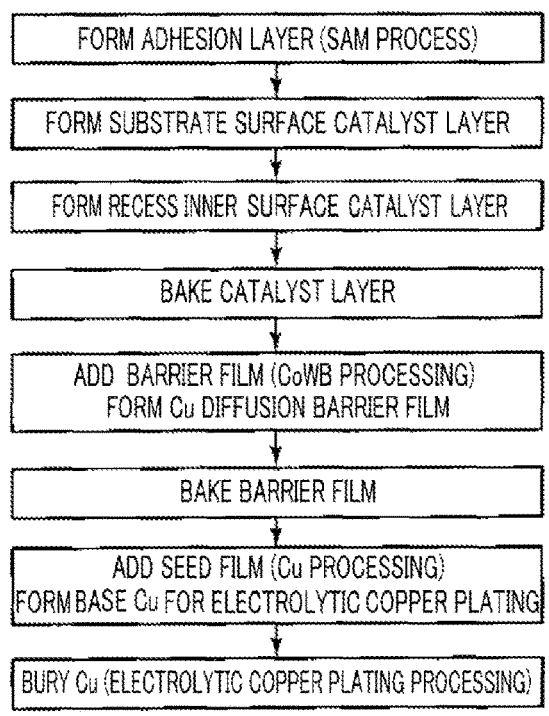
FIG. 2 is a flowchart showing a plating method including a catalyst layer forming method according to the exemplary embodiment.

In the adhesion layer forming unit 12 of the plating system 10, an adhesion layer 21 is formed on the substrate 2 having thereon the recess 2a (FIG. 2 and FIG. 3A).

Here, as a method of forming the recess 2a on the substrate 2, a commonly known method in the art may be appropriately employed. Specifically, as a dry etching technique, for example, a general-purpose technique using a fluorine-based gas or a chlorine-based gas may be employed. Especially, in order to form a hole having a high aspect ratio (a hole depth/a hole diameter), a method using an ICP-RIE (Inductively Coupled Plasma Reactive Ion Etching) technique, which can perform a deep etching processing with a high speed, may be more appropriately adopted. Especially, a Bosch process in which an etching processing using sulfur hexafluoride ($SF_6$) and a protection processing using a teflon-based gas such as $C_4F_8$ are repeatedly performed may be appropriately utilized.

Further, the adhesion layer forming unit 12 has a decompression chamber (not shown) equipped with a heating unit. In the adhesion layer forming unit 12, a coupling agent such as a silane coupling agent is adsorbed onto the substrate 2 having the recess 2a, so that the adhesion layer 21 is formed on the substrate 2 (SAM processing). The adhesion layer 21 formed by adsorbing the silane coupling agent is configured to improve adhesivity between the substrate 2 and a catalyst layer 22 to be described later.

The substrate 2 on which the adhesion layer 21 is formed in the adhesion layer forming unit 12 is then transferred into the catalyst layer forming unit 13 shown in FIG. 5 and FIG. 6, by the substrate transfer arm 11. In the catalyst layer forming unit 13, palladium nanoparticles (n-Pd) serving as the catalyst are adsorbed on the adhesion layer 21 of the substrate 2, so that the catalyst layer 22 is formed (FIG. 3B and FIG. 3C).

Hereinafter, a catalyst layer forming processing in the catalyst layer forming unit 13 according to the present exemplary embodiment will be described.

The substrate 2 is arranged on the substrate holding/rotating device 110 of the catalyst layer forming unit 13.

Then, as illustrated in FIG. 4, the substrate 2 is rotated by the substrate holding/rotating device 110 while DIW (deionized water) is supplied onto the substrate 2 through the nozzle 92 of the nozzle head 104 at a flow rate of 1.5 L/min for 1 minute. In this case, the rotation number of the substrate 2 is set to be 500 rpm, and the nozzle 92 of the nozzle head 104 is stopped above a central portion 2A of the substrate 2.

Then, while the substrate 2 is continued to be rotated at a rotation number of 500 rpm, IPA (isopropyl alcohol) is supplied onto the substrate 2 through the nozzle 92 of the nozzle head 104 at a flow rate of 35 mL/min to 40 mL/min for 1 minute. In this case, the nozzle 92 of the nozzle head 104 is stopped above the central portion 2A of the substrate 2.

Then, while the substrate 2 is continued to be rotated at a rotation number of 500 rpm, the DIW is supplied onto the substrate 2 through the nozzle 92 of the nozzle head 104 at a flow rate of 1.5 L/min for 3 minutes. In this case, the nozzle 92 of the nozzle head 104 is stopped above the central portion 2A of the substrate 2.

As such, while the substrate 2 is rotated, the DIW, the IPA, and the DIW are supplied onto the substrate 2 in sequence, so that the inside of the recess 2*a* of the substrate 2 can be substituted with the deionized water (deionized water substitution processing).

Then, while the substrate 2 is rotated at a rotation number of 300 rpm, a catalyst liquid including palladium nanoparticles (n-Pd) serving as a catalyst is supplied onto the substrate 2 through the discharge nozzle 32 of the nozzle head 104 at a flow rate of 650 mL/min for 5 minutes.

In the meantime, the discharge nozzle 32 of the nozzle head 104 is moved back and forth between above the central portion 2A of the substrate 2 and above a peripheral portion 2B thereof. While the substrate 2 is rotated as such, the catalyst liquid is supplied onto the substrate 2 through the discharge nozzle 32 of the nozzle head 104 and the discharge nozzle 32 of the nozzle head 104 is moved back and forth between above the central portion 2A of the substrate 2 and above the peripheral portion 2B thereof. As a result, the catalyst liquid can be widely diffused to the entire surface of the substrate 2. Since the catalyst liquid is supplied to the entire surface of the substrate 2, a substrate surface catalyst layer 22A can be formed by adsorbing the catalyst to the entire surface of the substrate 2 (first supply processing).

In the first supply processing, the substrate surface catalyst layer 22A can be uniformly formed on the entire surface of the substrate 2. The substrate surface catalyst layer 22A reaches from an outer surface of the recess 2*a* to a part of an inner surface of the recess 2*a*, but cannot reach the entire inner surface of the recess 2*a* (see FIG. 3B).

Then, while the substrate 2 is rotated at a rotation number of 500 rpm, the catalyst liquid is supplied onto the substrate 2 through the discharge nozzle 32 of the nozzle head 104 at a flow rate of 1.0 L/min for 5 minutes.

In the meantime, the discharge nozzle 32 of the nozzle head 104 is stopped above the central portion 2A of the substrate 2. While the substrate 2 is rotated as such, the catalyst liquid is supplied onto the substrate 2 through the discharge nozzle 32 of the nozzle head 104 and the discharge nozzle 32 of the nozzle head 104 is stopped above the central portion 2A of the substrate 2. As a result, rectification of the catalyst liquid from the central portion 2A of the substrate 2 toward the peripheral portion 2B thereof can be formed on the entire surface of the substrate 2. Since the rectification of the catalyst liquid from the central portion 2A toward the peripheral portion 2B is formed on the entire surface of the substrate 2, the catalyst liquid can be reliably introduced into the recess 2*a* and a recess inner surface catalyst layer 22B can be formed by adsorbing the catalyst to the entire inner surface of the recess 2*a* of the substrate 2 (second supply processing).

Through the second supply processing, the recess inner surface catalyst layer 22B can be uniformly formed on the inner surface of the recess 2*a*. Thus, with the substrate surface catalyst layer 22A and the recess inner surface catalyst layer 22B, the catalyst layer 22 uniformly formed on the entire surface of the substrate 2 and the entire inner surface of the recess 2*a* can be obtained.

Then, while the substrate 2 is continued to be rotated at a rotation number of 500 rpm, the DIW is supplied onto the substrate 2 through the nozzle 92 of the nozzle head 104 at a flow rate of 1.0 L/min for 10 minutes, so that a rinsing processing is performed to the substrate 2. In this case, the nozzle 92 of the nozzle head 104 is stopped above the central portion 2A of the substrate 2.

Then, while the substrate 2 is rotated at a rotation number of 300 rpm, the IPA is supplied onto the substrate 2 through the nozzle 92 of the nozzle head 104 at a flow rate of 35 mL/min to 40 mL/min for 1 minute. In this case, the nozzle 92 of the nozzle head 104 is moved back and forth between above the central portion 2A of the substrate 2 and above the peripheral portion 2B thereof. Then, while the substrate 2 is rotated at a rotation number of 550 rpm for 70 seconds, the supply of the IPA through the nozzle 92 is stopped. Then, a drying processing in which the substrate 2 is dried by removing the DIW on the substrate 2 is performed.

In the drying processing to the substrate 2, a $N_2$ gas may be discharged onto the substrate 2 to control the drying processing.

As such, in the catalyst layer forming unit 13, the catalyst layer 22 uniformly formed on the entire surface of the substrate 2 and the entire inner surface of the recess 2*a* can be obtained.

Further, as the second supply processing, there has been described the case where the catalyst liquid is supplied through the discharge nozzle 32 of the nozzle head 104 and the discharge nozzle 32 is stopped above the central portion 2A of the substrate 2 while the substrate 2 is rotated. However, the present exemplary embodiment is not limited thereto. The discharge nozzle 32 may be slightly moved back and forth near above the central portion 2A of the substrate 2.

Hereinafter, the catalyst liquid supplied to the substrate 2 and the catalyst 22*a* included in the catalyst liquid will be described. Firstly, the catalyst 22*a* will be described.

As the catalyst 22*a* adsorbed onto the adhesion layer 21 of the substrate 2, a catalyst having the catalysis that promotes a plating reaction may be appropriately used. By way of example, a catalyst formed of a nanoparticle may be used. Herein, the nanoparticle refers to a colloidal particle having the catalysis and having an average particle diameter of 20 nm or less, for example, 0.5 nm to 20 nm. Examples of elements constituting the nanoparticle may include palladium, gold, platinum, etc. A palladium nanoparticle may be represented as n-Pd.

Further, as an element constituting the nanoparticle, ruthenium may be used.

A method of measuring an average particle diameter of the nanoparticles is not particularly limited, and various methods may be used. By way of example, in the case of measuring the average particle diameter of the nanoparticles included in the catalyst liquid, a dynamic light scattering method may be used. The dynamic light scattering method refers to a method of measuring the average particle diameter of the nanoparticles by irradiating a laser beam to the nanoparticles dispersed in the catalyst liquid and observing the scattered light. Further, in the case of measuring an average particle diameter of the nanoparticles adsorbed onto the recess 2*a* in the substrate 2, a predetermined number of nanoparticles, for example, 20 nanoparticles are detected from an image obtained by TEM or SEM, and then, the average particle diameter of these nanoparticles is calculated.

Hereinafter, the catalyst liquid including the catalyst formed of the nanoparticle will be described. The catalyst liquid contains ions of a metal constituting the nanoparticle serving as the catalyst. By way of example, if the nanoparticles are formed of palladium, the catalyst liquid may contain a palladium compound such as palladium chloride as a palladium ion source.

A specific composition of the catalyst liquid is not particularly limited, but desirably, the composition of the catalyst liquid is set such that a viscosity coefficient of the catalyst liquid is 0.01 Pa·s or less. By setting the viscosity coefficient of the catalyst liquid within the above-described range, even if a diameter of the recess 2a in the substrate 2 is small, the catalyst liquid can be sufficiently diffused to a lower portion of the recess 2a in the substrate 2. Thus, the catalyst 22a can be more reliably adsorbed to the lower portion of the recess 2a in the substrate 2.

Desirably, the catalyst 22a in the catalyst liquid is coated with a dispersant. Thus, surface energy at an interface of the catalyst 22a can be low. Therefore, it is assumed that diffusion of the catalyst 22a in the catalyst liquid can be further promoted, and, thus, the catalyst 22a can reach the lower portion of the recess 2a in the substrate 2 in a shorter time. Further, it is assumed that it is possible to suppress multiple catalysts 22a from being agglomerated and thus increased in the particle diameter. As a result, it is possible to promote the diffusion of the catalyst 22a in the catalyst liquid.

A method of preparing the catalyst 22a coated with the dispersant is not particularly limited. By way of example, the catalyst liquid including the catalyst 22a previously coated with the dispersant may be supplied to the catalyst layer forming unit 13. Otherwise, the catalyst layer forming unit 13 may be configured such that a processing of coating the catalyst 22a with the dispersant is performed within the catalyst layer forming unit 13, for example, by the catalyst liquids supply device 30.

To be specific, the dispersant may be desirably polyvinylpyrrolidone (PVP), polyacrylic acid (PAA), polyethyleneimine (PEI), tetramethylammonium (TMA), citric acid, and the like.

Besides, various chemical agents for adjusting characteristics may be added to the catalyst liquid.

The catalyst liquid including the catalyst 22a is not limited to a catalyst liquid including nanoparticles such as n-Pd. An aqueous solution of palladium chloride ($PdCl_2$) may be used as the catalyst liquid, and Pd ions from palladium chloride ($PdCl_2$) may be used as the catalyst 22a.

As such, after the catalyst layer 22 is formed on the substrate 2 in the catalyst layer forming unit 13, the substrate 2 is transferred to the plating layer forming unit 14 by the substrate transfer arm 11

Subsequently, in the plating layer forming unit 14, the plating layer 23 serving as a Cu diffusion barrier film (barrier film) is formed on the catalyst layer 22 of the substrate 2 (FIG. 3D).

In this case, the plating layer forming unit 14 is configured as the liquid processing apparatus as illustrated in FIG. 5 and FIG. 6. The plating layer 23 can be formed by performing an electroless plating processing on the catalyst layer 22 of the substrate 2.

When forming the plating layer 23 in the plating layer forming unit 14, a plating liquid containing, for example, Co—W—B may be used, and a temperature of the plating liquid is maintained at 40° C. to 75° C. (desirably, 65° C.).

By supplying the plating liquid containing the Co—W—B onto the substrate 2, the plating layer 23 containing the Co—W—B is formed on the catalyst layer 22 of the substrate 2 through the electroless plating processing.

Thereafter, the substrate 2, in which the plating layer 23 is formed on the catalyst layer 22, is transferred from the plating layer forming unit 14 into the airtightly sealed casing 15a of the plating layer baking unit 15 by the substrate transfer arm 11. Within the airtightly sealed casing 15a of the plating layer baking unit 15, the substrate 2 on the hot plate 15A is heated under the inert gas atmosphere where a $N_2$ gas is supplied in order to suppress the oxidation thereof. Accordingly, the plating layer 23 of the substrate 2 is baked (baking processing).

When baking the plating layer 23 in the plating layer baking unit 15, a baking temperature may be set to be in the range from, e.g., 150° C. to 200° C., and a baking time is set to be in the range from, e.g., 10 minutes to 30 minutes.

By baking the plating layer 23 on the substrate 2 as described above, moisture within the plating layer 23 can be removed outside, and, at the same time, the bond between metals within the plating layer 23 can be strengthened.

The plating layer 23 formed as such serves as the Cu diffusion barrier film (barrier film). Then, the substrate 2 on which the plating layer 23 serving as the barrier film is formed is transferred into the electroless Cu plating layer forming unit 16 by the substrate transfer arm 11.

Subsequently, in the electroless Cu plating layer forming unit 16, an electroless Cu plating layer 24 serving as a seed film for forming an electrolytic Cu plating layer 25 is formed on the plating layer 23 of the substrate 2 (FIG. 3E).

Here, the electroless Cu plating layer forming unit 16 is configured as the liquid processing apparatus as illustrated in FIG. 5 and FIG. 6. By performing the electroless plating processing on the plating layer 23 of the substrate 2, the electroless Cu plating layer 24 can be formed.

The electroless Cu plating layer 24 formed in the electroless Cu plating layer forming unit 16 serves as the seed film for forming the electrolytic Cu plating layer 25. A plating liquid used in the electroless Cu plating layer forming unit 16 may contain a copper salt as a source of copper ions, such as copper sulfate, copper nitrate, copper chloride, copper bromide, copper oxide, copper hydroxide, copper pyrophosphate, or the like. The plating liquid may further contain a reducing agent and a complexing agent for the copper ions. Further, the plating liquid may further contain various kinds of additives for improving stability or speed of the plating reaction.

The substrate 2 on which the electroless Cu plating layer 24 is formed as described above is then sent to the electrolytic Cu plating layer forming unit 17 by the substrate transfer arm 11. Here, the substrate 2 on which the electroless Cu plating layer 24 is formed may be sent to the electrolytic Cu plating layer forming unit 17 after transferred into the plating layer baking unit 15 to be baked therein. Subsequently, an electrolytic Cu plating processing is performed on the substrate 2 within the electrolytic Cu plating layer forming unit 17, so that the electrolytic Cu plating layer 25 is buried within the recess 2a of the substrate 2 while using the electroless Cu plating layer 24 as the seed film (FIG. 3F).

Thereafter, the substrate 2 is carried out from the plating system 10, and a rear surface side of the substrate 2 (opposite side to the side where the recess 2a is formed) is polished chemically and mechanically (FIG. 3G).

As described above, according to the present exemplary embodiment, in the catalyst layer forming unit 13, the catalyst liquid is supplied onto the entire surface of the substrate 2 during the first supply processing, so that the substrate surface catalyst layer 22A can be uniformly formed on the entire surface of the substrate 2, and the catalyst liquid is also supplied onto the entire inner surface of the recess 2a during the second supply processing, so that the recess inner surface catalyst layer 22B can also be uniformly formed on the entire inner surface of the recess 2a of the substrate 2.

MODIFICATION EXAMPLE OF PRESENT EXEMPLARY EMBODIMENT

Hereinafter, a modification example of the present exemplary embodiment will be described. In the above-described exemplary embodiment, there has been described the case where, while the substrate 2 is rotated, the catalyst liquid is supplied through the discharge nozzle 32 of the nozzle head 104 and the discharge nozzle 32 is moved back and forth between above the central portion 2A of the substrate 2 and the peripheral portion 2B thereof in the first supply processing, but the exemplary embodiment is not limited thereto. The catalyst liquid may be supplied onto the entire surface of the substrate 2 in a spray form by using a spray nozzle (not illustrated). In this case, the substrate 2 may be rotated or may be stopped.

If the catalyst liquid is sprayed onto the entire surface of the substrate 2 by using the spray nozzle in the first supply processing, the catalyst liquid is supplied only onto the central portion of the substrate 2 by controlling a discharge range of the spray nozzle in the second supply processing. During the second supply processing, the substrate 2 is rotated.

As such, by using the spray nozzle instead of the discharge nozzle 32 of the nozzle head 104, the catalyst liquid can be supplied to be widely diffused to the entire surface of the substrate 2 in the first supply processing. Thus, the substrate surface catalyst layer 22A can be uniformly formed on the entire surface of the substrate 2. Further, the rectification of the catalyst liquid can be formed on the entire surface of the substrate 2 in the second supply processing. Thus, the recess inner surface catalyst layer 22B can be uniformly formed on the entire inner surface of the recess 2a.

In the above-described exemplary embodiment, the electrolytic Cu plating layer is formed through the electrolytic Cu plating processing. However, the exemplary embodiment may not be limited thereto, and it may be possible to form the Cu plating layer through the electroless Cu plating processing instead of the electrolytic Cu plating processing.

Additionally, in the above-described exemplary embodiment, when baking the plating layer 23, the substrate 2 is heated on the hot plate 15A under the inert-gas atmosphere of $N_2$ gas within the airtightly sealed casing 15a of the plating layer baking unit 15. However, the exemplary embodiment may not be limited thereto, and the substrate 2 may be heated on the hot plate 15A after evacuating the inside of the airtightly sealed casing 15a to a vacuum level, in order to lower the temperature or shorten the processing time.

Furthermore, in the above-described exemplary embodiment, the plating layer 23 is baked in the plating layer baking unit 15. Additionally, by providing a heating source such as a lamp irradiator 200 (UV light or the like) above the substrate 2 or a hot plate (not shown) covering the substrate 2 in the catalyst layer forming unit 13 shown in FIG. 5, it may be possible to bake the catalyst layer 22 within the catalyst layer forming unit 13.

We claim:

1. A catalyst layer forming method of forming a catalyst layer on a substrate, comprising:
    a preparation processing of preparing the substrate including a recess;
    a first supply processing of forming a substrate surface catalyst layer by supplying a catalyst liquid including a catalyst on the substrate such that the catalyst liquid is diffused to an outer surface of the recess and only a part of an inner surface of the recess and by adsorbing the catalyst to the outer surface of the recess and only said part of the inner surface of the recess; and
    a second supply processing of forming a recess inner surface catalyst layer by supplying the catalyst liquid to a central portion of the substrate while rotating the substrate and by adsorbing the catalyst to a remaining part of the inner surface of the recess on which the substrate surface catalyst layer has not been formed by the first supply processing.

2. The catalyst layer forming method of claim 1, wherein in the first supply processing, the catalyst liquid is supplied through a nozzle while the substrate is rotated, and the nozzle is moved back and forth between above the central portion of the substrate and above a peripheral portion thereof.

3. The catalyst layer forming method of claim 1, wherein in the first supply processing, the catalyst liquid is supplied through a spray nozzle to the outer surface of the recess and only said part of the inner surface of the recess of the substrate in a spray form.

4. The catalyst layer forming method of claim 1, wherein in the second supply processing, the catalyst liquid is supplied through a nozzle, and the nozzle is slightly moved back and forth near above the central portion of the substrate.

5. The catalyst layer forming method of claim 1, wherein in the second supply processing, the catalyst liquid is supplied through a nozzle, and the nozzle is stopped above the central portion of the substrate.

6. The catalyst layer forming method of claim 1, wherein in the second supply processing, the catalyst liquid is supplied through a spray nozzle to the central portion of the substrate in a spray form.

7. A non-transitory computer-readable recording medium having stored thereon computer-executable instructions that, in response to execution, cause a catalyst layer forming system to perform a catalyst layer forming method of forming a catalyst layer on a substrate,
    wherein the catalyst layer forming method includes:
    a preparation processing of preparing the substrate including a recess;
    a first supply processing of forming a substrate surface catalyst layer by supplying a catalyst liquid including a catalyst on the substrate such that the catalyst liquid is diffused to an outer surface of the recess and only a part of an inner surface of the recess and by adsorbing the catalyst to the outer surface of the recess and only said part of the inner surface of the recess; and
    a second supply processing of forming a recess inner surface catalyst layer by supplying the catalyst liquid to a central portion of the substrate while rotating the substrate and by adsorbing the catalyst to an a remaining part of the inner surface of the recess on which the substrate surface catalyst layer has not been formed by the first supply processing.

* * * * *